United States Patent [19]

Kasperkovitz

[11] Patent Number: 4,814,715

[45] Date of Patent: Mar. 21, 1989

[54] MIXER ARRANGEMENT FOR SUPPRESSION OF OSCILLATOR INTERFERENCE IN QUADRATURE DEMODULATORS

[75] Inventor: Wolfdietrich G. Kasperkovitz, Eindhoven, Netherlands

[73] Assignee: U.S. Philips Corporation, New York, N.Y.

[21] Appl. No.: 605,048

[22] Filed: Apr. 30, 1984

[30] Foreign Application Priority Data

May 10, 1983 [NL] Netherlands .......................... 8301651

[51] Int. Cl.[4] .......................... H03D 3/18; H03D 1/06
[52] U.S. Cl. ...................................... 329/50; 329/124; 329/168
[58] Field of Search .................. 329/50, 122, 124, 131, 329/132, 168; 455/295, 296, 303, 304, 305, 306, 310, 312

[56] References Cited

U.S. PATENT DOCUMENTS

| 3,949,309 | 4/1976 | Pecar | 455/296 |
|---|---|---|---|
| 4,243,955 | 1/1981 | Daniel et al. | 455/303 X |
| 4,313,211 | 1/1982 | Leland | 455/306 X |
| 4,501,004 | 2/1985 | Yoshida et al. | 455/306 X |

FOREIGN PATENT DOCUMENTS

2052196 1/1981 United Kingdom .................. 329/50

Primary Examiner—Eugene R. Laroche
Assistant Examiner—D. C. Mis
Attorney, Agent, or Firm—Thomas A. Briody; William J. Streeter; Edward W. Goodman

[57] ABSTRACT

Mixer arrangement (M) comprising first and second quadrature mixer stages ($M_1$ and $M_2$) to which quadrature mixing signals are applied from an oscillator circuit ($F_0$), these two mixer stages ($M_1$ and $M_2$) being coupled to a superposition circuit ($S_0$). To suppress interferences occurring in the output signal of the superposition circuit due to oscillator crosstalk or leakage and/or a d.c. offset of the mixer stages ($M_1$ and $M_2$) which are supplied with mixing signals by the oscillator cirucit $F_0$, the quadrature components of these interferences being in phase with the quadrature mixing signals are measured by means of first and second synchronous detectors ($SD_1$ resp. $SD_2$) to which detection carriers are applied in an in-phase or an anti-phase relationship with respect to the quadrature mixing signals. After sign inversion these quadrature components are fed back to the inputs of the two mixer stages ($M_1$ and $M_2$), resulting in an interference negative feedback.

2 Claims, 2 Drawing Sheets

MIXER ARRANGEMENT FOR SUPPRESSION OF OSCILLATOR INTERFERENCE IN QUADRATURE DEMODULATORS

BACKGROUND OF THE INVENTION

The invention relates to a mixer arrangement comprising first and second mixer stages to which quadrature mixing signals are applied from an oscillator circuit, these two mixer stages being coupled to a superposition circuit.

Such a mixer arrangement is disclosed in the article "A third method of generation and detection of SSB-signals" by D. K. Weaver, published in Proceedings of the IRE, 1956, Vol. 44, No. 12, pages 1703-1705.

In some applications of prior art mixer arrangements, the frequency of the oscillator is located in the frequency range of the desired signal at the outputs of the two mixer stages, such as, for example, in single-sideband receivers based on the demodulation principle described in the above-mentioned article. In those cases, this desired signal can be seriously disturbed by parasitic oscillator cross-talk and/or d.c. off-set in the mixer stages. a suppression of these oscillator frequency-coupled interferences, called oscillator interference hereinafter for the sake of brevity, in the desired signal by means of notch filters results, especially in the above-described application of the mixer arrangement, in a signal component suppression which is audible to an annoying degree.

A feed forward compensation of the oscillator interference by means of a compensating signal derived from the oscillator signal, such as, for example, described in United Kingdom Patent Application No. 811,274, to compensate for oscillator radiation, only operates correctly for one given amplitude and phase of the oscillator interference. However, the amplitude and the phase of the oscillator interference vary and depend inter alia on the oscillator frequency, on the magnitude of said d.c.-offset of the relevant mixer stages and on the magnitude of the reactance of the undesired parasitic, usually capacitive couplings in or at the mixer stages, which can be infuenced to such an extent by constructional tolerances, temperature fluctuations, aging, etc., that they can, in practice, not be determined unambiguously.

SUMMARY OF THE INVENTION

The invention has for its object to provide a mixer arrangement of the type described in the opening paragraph in which interferences coupled to the oscillator frequency and being a result of oscillator cross-talk and/or d.c.-offset in the mixer stages can be suppressed to a significant extent, adaptively and substantially independent of the variation of their phase and amplitude, without affecting adjacent signal components.

According to the invention, such a mixer arrangement is characterized by first and second quadrature interference negative feedback paths for a negative feedback of oscillator frequency-coupled interferences from an output of the superposition circuit to inputs of two mixer stages, comprising first and second synchronous detectors, respectively coupled to the output of the superposition circuit and also via first and second low-pass filters to inputs of the first and second mixer stages, quadrature carriers which are in an in-phase or an anti-phase relationship with the quadrature mixing signals being applied to these synchronous detectors from the oscillator circuit, whereas for the case in which there is an in-phase relationship between at least one of the carriers and one of the mixing signals, the interference negative feedback path in which the synchronous detector which is fed by the last-mentioned carrier is included, also comprises an inverter circuit for inverting the sign of the signal.

The invention is based on the recognition that the total resultant oscillator interference at the output of the superposition circuit can be resolved into quadrature noise components in the respective phase directions of the quadrature mixing signals applied to the two mixer stages and that the quadrature noise components can be suppressed in a simple way by negatively feeding them back to the input of the respective mixer stages after a frequency translation.

When the measure according to the invention is applied, the magnitude of the quadrature noise components is measured, or in other words converted into varying d.c. voltages by means of the two synchronous detectors and the two low-pass filters and a negative feedback of the interference is effected by applying these d.c. voltages with inverted signs to the two mixer stages. Therein these d.c. voltages modulate the quadrature mixing signals, which results in quadrature noise compensating signals which in the superposition circuit suppress to a significant extent the total resultant oscillator interference at an adequate negative feedback gain.

The signal inversion of the signal in each of the two quadrature interference negative feedback paths can be obtained in different manners, for example by bringing the carrier or carriers required for the synchronous detection of one or both of the quadrature noise components in anti-phase relationship with the mixing signal or mixing signals required for the modulation thereof, which can, for example, be realized in a simple way with a push-pull construction of the oscillator circuit. if, because of a given construction of the oscillator circuit one can only dispose of quadrature carriers which are inphase with the quadrature mixing signals, then a sign inversion is obtained by means of the inverter circuit, which may be included in the RF-section (for the synchronous detector) or in the LF section (subsequent to the synchronous detector) of the relevant interference negative feedback path.

A preferred embodiment of a mixer arrangement is characterized by an in-phase relationship between the two carriers and the two mixing signals, by first and second subtracting circuits whose inverting inputs are coupled to the first and second low-pass filters, respectively, whose non-inverting inputs are coupled to first and second quadrature inputs of the mixer arrangement, respectively, and whose outputs are coupled to the inputs of the first and the second mixing stages, respectively, and in that the output of the superposition circuit is connected to an output of the mixer arrangement.

When this measure is applied, the mixer arrangement is particularly suitable for use in receivers based on the demodulation principle as described, for example, in the above-mentioned article. The mixer arrangement is then preceded by an RF-tuning arrangement comprising a pair of quadrature mixer stages in which a desired RF-receiving signal is converted into a pair of low-frequency quqdrature signals, at which a folding of the frequency spectrum may occur. Depending on the choice of the oscillator frequency, these low-frequency quadrature signals are converted in the mixer arrangement in a manner which is known per set into a baseband or intermediate-frequency signals. To that end, the two mixer stages of the mixer arrangement have two functions: on the one hand they form the above-mentioned modulated quadrature compensating signals, on the other hand they have a signal processing function.

Another preferred embodiment of the mixer arrangement, is characterized by a further mixing signal applied from the oscillator circuit, an input of the mixer arrangement corresponding to an input of the third mixer stage and an output of the third mixer stage being connected to an input of the superposition circuit.

When this measure is applied, the further mixer stage has for its sole object to process the signal and the first and second mixer stages have for their sole objects to form the quadrature interference compensating signals. These interference compensating signals do then not only compensate for the oscillator interferences produced at the first and second mixer stages, but also the oscillator interference produced at the further mixer stage in the signal direction. This measure is, for example, advantageous for stereo decoders.

A further preferred embodiment of the last-mentioned mixer arrangement, is characterized by a frequency-dividing circuit arranged between the further mixer stage and the oscillator circuit.

The use of this measure prevents higher order interferences in the output signal of the further mixer stage which may be produced by a shift in the direct current setting (d.c. offset) and a higher harmonic in the (possibly discrete) mixing signal applied to the further mixer stage, cross-talk or leakage thereof or because of switching in-accuracies in the further mixing stage in case it is in the form of a time-discrete multiplier. The order of the interferences to be suppressed is adjustable by means of the frequency dividing factor of the frequency dividing circuit.

Another preferred embodiment of a mixer arrangement is characterized by a further mixer stage to which a mixing signal is applied from the oscillator circuit, an output of the third mixer stage corresponding with an output of the mixer arrangement and an input being coupled to an input of the mixer arrangement via the superposition circuit.

When this measure is applied, the first and second mixer stages are again used only for forming said quadrature interference compensating signals and the further mixer stage only for signal processing, but in contrast with the last-mentioned preferred embodiments the total oscillator interference is suppressed in a direction opposite to the signal direction, as is, for example, desired in RF-input stages for the suppression of oscillator radiation.

DESCRIPTION OF THE DRAWINGS

The invention will now be described in greater detail, by way of example with reference to the FIGURES shown in the accompanying drawings, in which corresponding elements have been given the same references. Therein.

DESCRIPTION OF THE PREFERRED EMBODIMENTS

Figure 1:
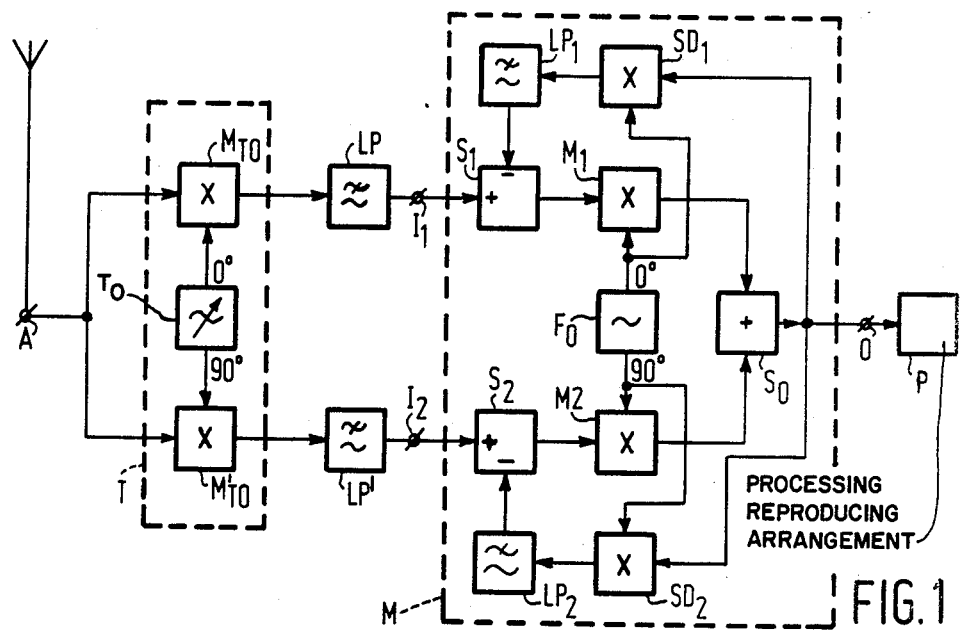
FIG. 1 shows a first embodiment of a mixer arrangement according to the invention for processing quadrature input signals in a receiver comprising a quadrature RF-tuning device preceding the mixer arrangement.

FIG. 1 shows a receiver having coupled to an aerial input A a quadrature RF-tuning device T having quadrature outputs, which are connected to quadrature inputs $I_1$ and $I_2$ of a mixer arrangement M, according to the invention, via low-pass filters LP and LP'. The quadrature RF-tuning device T comprises a pair of quadrature mixer stages $M_{TO}$ and $M_{TO}'$, to which quadrature mixing signals are applied from a tuning oscillator $T_O$ and which converts a desired RF-receiving signal into a pair of low-frequency quadrature sub-signals.

These quadrature sub-signals are selected by means of said low-pass filters LP and LP' and in the mixer arrangement M, applied to first and second mixer stages and $M_1$ and $M_2$ via first and second subtracting circuits $S_1$ and $S_2$ still to be described. From an oscillator circuit $F_O$, quadrature mixing signals are applied to these mixer stages $M_1$ and $M_2$, as a result of which the quadrature subsignals are converted into in-phase and anti-phase signal components and are simultaneously subjected to a frequency translation. By adding these signal components together in a superposition circuit $S_O$, the desired signal is obtained which, depending on the oscillation frequency of the oscillator circuits $T_O$ and $F_O$, may be located in the baseband or in an intermediate-frequency band. The desired signal thus obtained is applied via an output O, which is common to the superposition circuit $S_O$ and the mixer arrangement M, to a processing and reproducing arrangement P, in which in a manner known per se further processing and reproduction of the desired signal is effected.

The description of the signal processing given in the foregoing of the receiver shown is sufficient to understand the invention. For further details of this receiver, more specifically as regards the reception of single-sideband signals, reference is made to the above-mentioned article.

According to the invention, the mixer arrangement M also comprises first and second interference negative feedback paths ($SD_1$, $LP_1$, $S_1$) and ($SD_2$, $LP_2$, $S_2$), respectively, which include first and second synchronous detectors $SD_1$ and $SD_2$, respectively, signal inputs of which are coupled to the output O and carrier inputs of which are coupled to the oscillator circuit $F_O$. Outputs of the synchronous detectors $SD_1$ and $SD_2$ are coupled to inverting inputs of the subtracting circuits $S_1$ and $S_2$ via first and second low-pass filters $LP_1$ and $LP_2$, respectively. Non-inverting inputs of the subtracting circuits $S_1$ and $S_2$ are coupled to the low-pass filters LP and LP', respectively, and outputs thereof are coupled to inputs of the two mixer stages $M_1$ and $M_2$, respectively.

Figure 3:
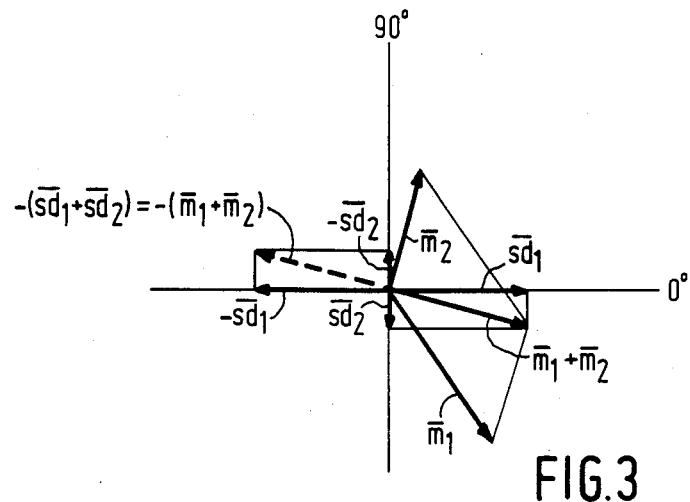
FIG. 3 shows a vector diagram associated with the mixer arrangement shown in FIG. 1.

Due to a shift in the direct current setting and/or oscillator cross-talk, or leakage in or at the two mixer stages $M_1$ and $M_2$, so-called oscillator interferences occur in the signal at the outputs of these mixer stages $M_1$ and $M_2$ in situ of the oscillator frequency. Taking a quadrature relationship between the mixing signals of the two mixer stages $M_1$ and $M_2$ as a starting point, as shown by the system of co-ordinates in the vector diagram of FIG. 3, these oscillator interferences in this vector diagram can be represented by interference factors $\overline{m}_1$ and $\overline{m}_2$, respectively. In the superposition circuit $S_O$, which may optionally be formed by a junction point, a vectorial addition of these interference vectors $\overline{m}_1$ and $\overline{m}_2$ is effected, which results in a total or resultant interference sum vector $\overline{m}_1 + \overline{m}_2$.

In the embodiments shown, the quadrature carriers applied to the synchronous detectors $SD_1$ and $SD_2$ are in phase with the quadrature carriers applied to the mixer stages $M_1$ and $M_2$ and the first quadrature component $\overline{sd}_1$ of the interference vector $\overline{m}_1 + \overline{m}_2$ is in phase with the mixing signal applied to the first mixer stage $M_1$, and the second quadrature component $\overline{sd}_2$ is in phase with the mixing signal applied to the second mixer stage $M_2$. These detected quadrature interference components $\overline{sd}_1$ and $\overline{sd}_2$ are subtracted in the subtracting circuits $S_1$ and $S_2$ from the quadrature input signals mentioned in the foregoing, after being filtered in the first and second low-pass filters $LP_1$ and $LP_2$. In this situation, the subtracting circuits $S_1$ and $S_2$ operate as inverter circuits for the respective quadrature interference components $\overline{sd}_1$ and $\overline{sd}_2$, which are subjected therein to sign inversion. In the two mixer stages $M_1$ and $M_2$, the inverted quadrature interference components $-\overline{sd}_1$ and $-\overline{sd}_2$ are modulated on the oscillator frequency, and result in quadrature interference compensating signals which, in the superposition circuit $S_O$, form an interference compensation sum vector $-(\overline{sd}_1 + \overline{sd}_2)$, which is equal to and in the opposite direction to the above-mentioned total interference vector $\overline{m}_1 + \overline{m}_2$. Depending on the open loop gain A in the interference negative feedback paths $(SD_1, LP_1, S_1)$ and $(SD_2, LP_2, S_2)$, respectively, and the mixer stages $M_1$ and $M_2$, respectively, the total interference vector $\overline{m}_1 + \overline{m}_2$ is suppressed by a vector of $1/1+A$.

It is obvious that an interference reduction already takes place at an open loop gain less than unity. However, for an effective interference suppression, the said open loop gain A will in practice be chosen to be much higher than 1 and more specifically in such a way that an optimum ratio is reached between the loop bandwidth and the stability.

To that end amplifier devices, not shown, can be included in an obvious manner in said two interference negative feedback paths $(SD_1, LP_1, S_1)$ and $(SD_2, LP_2, S_2)$.

It will further be clear that the subtracting circuits $S_1$ and $S_2$ can be replaced in a simple way by adder circuits or simple junction points, not shown, if inverter circuits, not shown, which are known per se are included in the signal paths before the subtractor circuits $S_1$ and $S_2$, that is to say between the output O and the respective synchronous detectors $SD_1$ and $SD_2$, it being possible to realize the inverter circuit by means of, for example, delay circuits, or between the synchronous detectors $SD_1$, $SD_2$ and the subtracting circuits $S_1$, $S_2$, respectively. Alternatively, a sign inversion can be obtained by means of an anti-phase relationship between the quadrature carrier applied to the synchronous detectors $SD_1$ and/or $SD_2$ on the one hand and the mixing signal applied to the mixer stages $M_1$ and/or $M_2$, respectively. Starting from reference quadrature phases 0° and 90° for the two quadrature mixing signals, the phases of the two carriers can then, for example, be 180° and 270°. As a result thereof the above-mentioned inverted quadrature noise components $-\overline{sd}_1$ and $-\overline{sd}_2$ are then directly obtained at the outputs of the synchronous detectors $SD_1$ and $SD_2$. Such an implementation, not shown, is possible if, for example, the oscillator circuit $F_O$ is of a push-pull construction, quadrature oscillator signals being available in phase and in anti-phase.

Figure 2:
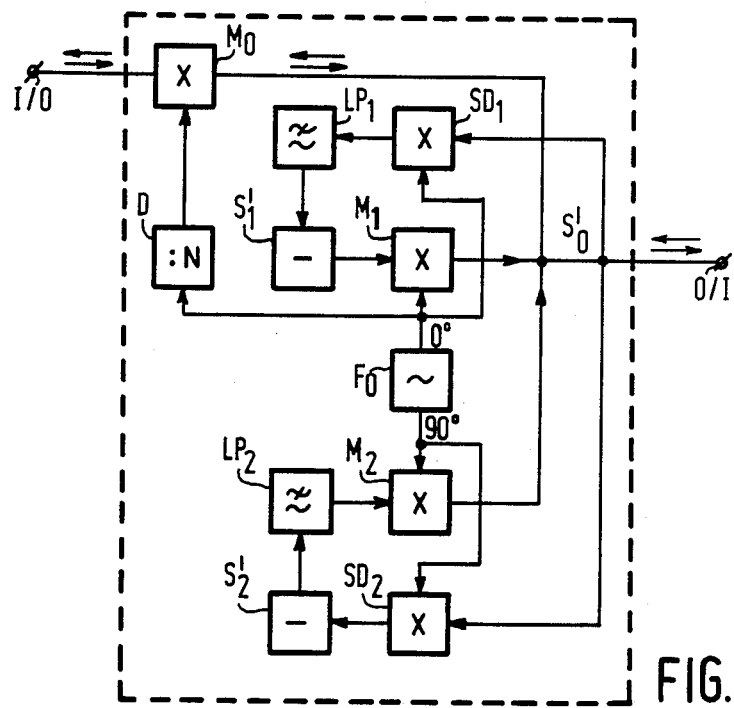
FIG. 2 shows a second embodiment of a mixer arrangement which in a first mode of application is suitable for suppressing downstream oscillator interference and in a second mode of application for suppression of upstream oscillator interference.

FIG. 2 shows a second embodiment of a mixer arrangement M according to the invention having first and second terminals I/O and O/I, respectively and a further mixer stage $M_O$ connected therebetween. A mixing signal input of this mixer stage $M_O$ is coupled to an output of the oscillator circuit $F_O$ via a frequency dividing circuit D, still further to be described, and, depending on the frequency dividing factor N of the frequency dividing circuit D, its frequency may be equal to one or a factor of $1/N$ times the oscillator frequency, where $N = 2, 3, 4 \ldots$ Similar to the output O of the embodiment shown in FIG. 1, the second terminal O/I is coupled to an output of the superposition circuit $S'_O$, which is in the form of a junction point, while for a sign inversion of the quadrature noise components $\overline{sd}_1'$ and $\overline{sd}_2'$ still further to be described, inverter circuits $S_1'$ and $S_2'$, which are known per se, are used instead of the subtracting circuits $S_1$ and $S_2$.

For an interference suppression in the signal direction, that is to say a downstream suppression of interferences in the ouptut signal of the further mixer stage $M_O$, the first terminal I/O functions as the input and the second terminal O/I as the output of both the mixer arrangement M and the further mixer stage $M_O$. If a suppression of interferences in the output signal of the mixer arrangement M at the frequency of the mixing signal applied to the further mixer stage $M_O$ is desired, which is, for example, the case in stereo decoders, then the frequency dividing factor is 1. In that case the frequency dividing circuit D has no function and may be omitted or optionally be short-circuited.

Figure 4:
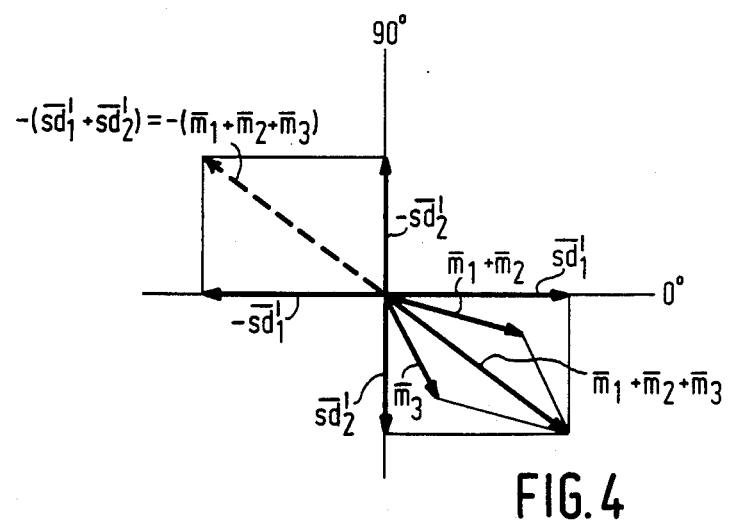
FIG. 4 shows a vector diagram associated with the mixer arrangement shown in FIG. 2.

The oscillator interference in the output signal of the further mixer stage $M_O$ is shown in the vector diagram of FIG. 4 by way of example with the aid of an interference vector $\overline{m}_3$. In the junction point $S_O$, which functions as a superposition circuit this interference vector $\overline{m}_3$ is added to the interference sum vector $\overline{m}_1 + \overline{m}_2$, already described in the foregoing, of the oscillator interferences in the output signals of the first and second mixer stages $M_1$ and $M_2$. This addition results in a new total interference sum vector $\overline{m}_1 + \overline{m}_2 + \overline{m}_3$ whose quadrature interference components $\overline{sd}_1'$ and $\overline{sd}_2'$ in the respective phase directions of the quadrature mixing signals applied to the first and second mixer stages $M_1$ and $M_2$ are detected in the two synchronous detectors $Sd_1$ and $SD_2$, respectively. In correspondence with what has already been described in the foregoing for the quadrature interference components $\overline{sd}_1$ and $\overline{sd}_2$, quadrature interference compensating signals are formed by inversion and modulation, whose vectorial sum $-(\overline{sd}_1' + \overline{sd}_2')$ in the junction point $S_O$ is equal to an oppositely directed to the total interference sum vector $\overline{m}_1 + \overline{m}_2 + \overline{m}_3$ and suppresses it in dependence on the negative feedback gain, at least to a significant extent.

If a suppression of higher order interferences in the output signal of the mixer arrangement M is desired, for example interferences in situ of the $n^{th}$ harmonic of the mixing signal of the further mixer stage $M_O$ such as may occur, for example, more specifically in time-discrete mixing processes in the further mixer stage $M_O$ when formed as a discrete multiplier circuit, then the oscillator frequency must amount to n times the frequency of the said mixing signal and the frequency dividing circuit D must be adjusted to a frequency-dividing factor n. A negative feedback and suppression of the last-mentioned $n^{th}$ order interferences is effected via the interference negative feedback paths (SD$_1$, LP$_1$, S$_1$') and (SD$_2$, LP$_2$, S$_2$') and the two mixer stages M$_1$ and M$_2$.

It will be obvious that combinations of higher order interferences can be suppressed by means of combinations of pairs of interference negative feedback paths and mixer stages. Thus, it is very well possible to suppress both the 1$^{st}$ and the 3$^{rd}$-order interferences in the output signal of the further mixer stage M$_O$. To that end the oscillator frequency must correspond to the highest of the noise frequencies to be suppressed, that is to say three times the frequency of the mixing signal of the further mixing stage M$_O$, and the frequency dividing factor of the frequency dividing circuit D must be 3. The frequency dividing circuit D must then be capable of producing in a manner known per se, in addition to an output signal to be applied as a mixing signal to the further mixer stage M$_O$ a signal which with respect thereto is a quadrature output signal. These two quadrature output signals must be applied as quadrature mixing signals to third and fourth mixer stages, not shown, as an quadrature carriers to third and fourth synchronous detectors, also not shown, of third and fourth interference negative feedback paths, to suppress the 1$^{st}$ order interferences in the output signal of the further mixer stage M$_O$. These third and fourth mixer stages and interference negative feedback paths must then be connected with respect to each other in the same way as the mixer stages M$_1$ and M$_2$ and the interference negative feedback parts (SD$_1$, LP$_1$, S$_1$') and (SD$_2$, LP$_2$, S$_2$'), which is not shown. Their junction point, which functions as a superposition circuit, must then be coupled to the junction point S$_O$.

For suppressing an upstream interference, that is an interference in a direction which is opposite to the signal direction, e.g. in the input signal of the mixer arrangement M shown in FIG. 2, for example for reducing oscillator radiation, the first terminal I/O functions as an (IF-) output and the second terminal O/I as an (aerial) input of the mixer arrangement M and the further mixer stage M$_O$. The frequency dividing circuit D then has the same function as in the application described in the foregoing, which may be omitted or optionally short-circuited if only the suppression of oscillator radiation is desired. The suppression of oscillator radiation proceeds in all respect in correspondence with the above-described suppression of the noise vector $\overline{m}_3$.

It should be noted that the invention is not limited to the shown and described embodiments. It is, for example, highly possible, while applying the inventive idea, to substitute a subtracting circuit in combination with a suitably chosen signal sign inversion in one or both interference negative feedback paths as a superposition circuit S$_O$ for an adder circuit or junction point.

It is alternatively possible to use in the embodiment shown in FIG. 2, a frequency multiplier circuit instead of the frequency dividing circuit D for suppressing an $n^{th}$ order interference. The oscillator frequency must then correspond to the mixing frequency in the further mixer stage M$_O$ and must be applied in a phase-quadrature relationship to the two first and second synchronous detectors and to the two first and second mixer stages after the frequency has been multiplied by a factor of n in the said frequency multiplying circuit.

What is claimed is:

1. A mixer arrangement comprising first and second mixer stages having respective first inputs to which quadrature carrier signals are applied, respective second inputs and outputs, an oscillator circuit for applying quadrature mixing signals to said second inputs of said first and second mixer stages, and a superposition circuit for combining the outputs of said first and second mixer stages, wherein said mixer arrangement further comprises first and second quadrature feedback paths coupling an output of said superposition circuit to said first inputs of said first and second mixer stages, respectively, and said first and second quadrature feedback paths respectively comprising first and second synchronous detectors having respective first inputs coupled to the output of said superposition circuit, respective second inputs to which are applied quadrature mixing signals, and outputs; low-pass filters coupled, respectively, to the outputs of said first and second synchronous detectors; and means for coupling outputs of said low-pass filters and said quadrature carrier signals to the first inputs of said first and second mixer stages, respectively, characterized in that the quadrature mixing signals applied to said synchronous detectors are in phase, respectively, to the quadrature mixing signals applied to said mixer stages and said coupling means comprises first and second subtracting circuits having inverting inputs coupled to the first and second low-pass filters, respectively, non-inverting inputs for receiving said quadrature carrier signals, respectively, and outputs coupled to the first inputs of the first and the second mixer stages, respectively, the output of the superposition circuit being connected to an output of the mixer arrangement.

2. A mixer arrangement comprising first and second mixer stages having respective first inputs to which quadrature carrier signals are applied, respective second inputs and outputs, an oscillator circuit for applying quadrature mixing signals to said second inputs of said first and second mixer stages, and a superposition circuit for combining the outputs of said first and second mixer stages, wherein said mixer arrangement further comprises first and second quadrature feedback paths coupling an output of said superposition circuit to said first inputs of said first and second mixer stages, respectively, and said first and second quadrature feedback paths respectively comprising first and second synchronous detectors having respective first inputs coupled to the output of said superposition circuit, respective second inputs to which are applied quadrature mixing signals, and outputs; low-pass filters coupled, respectively, to the outputs of said first and second synchronous detectors; and means for coupling outputs of said low-pass filters and said quadrature carrier signals to the first inputs of said first and second mixer stages, respectively, characterized in that said mixer arrangement further comprises a further mixer stage having a second input to which a further mixing signal is applied, via a frequency-divider circuit, from the oscillator circuit, an input of the mixer arrangement being coupled to a first input of the further mixer stage and an output of the further mixer stage being connected to an input of the superposition circuit.

* * * * *